United States Patent [19]
Bolgiani

[11] Patent Number: 5,739,556
[45] Date of Patent: Apr. 14, 1998

[54] PRESSURE CONTACT HOUSING FOR SEMICONDUCTOR COMPONENTS

[75] Inventor: Fabio Bolgiani, Bellinzona, Switzerland

[73] Assignee: Asea Brown Boveri AG, Baden, Switzerland

[21] Appl. No.: 595,501

[22] Filed: Feb. 1, 1996

[30] Foreign Application Priority Data

Feb. 17, 1995 [DE] Germany ............ 195 05 387.7

[51] Int. Cl.⁶ ............ H01L 29/74; H01L 31/111; H01L 23/48
[52] U.S. Cl. ............ 257/182; 257/138; 257/147; 257/153; 257/181; 257/150; 257/178; 257/688; 257/785
[58] Field of Search ............ 257/138, 147, 257/153, 727, 181, 150, 688, 177, 178, 785

[56] References Cited

U.S. PATENT DOCUMENTS

| | | | |
|---|---|---|---|
| 4,092,703 | 5/1978 | Sueoka et al. | 257/138 |
| 4,238,761 | 12/1980 | Schlegel et al. | 257/138 |
| 4,529,999 | 7/1985 | Bender et al. | 257/138 |
| 4,737,834 | 4/1988 | Spenke et al. | 257/138 |
| 5,121,189 | 6/1992 | Niwayama . | |
| 5,345,096 | 9/1994 | Grüning | 257/182 |

FOREIGN PATENT DOCUMENTS

| | | | |
|---|---|---|---|
| 3538815 A1 | 10/1985 | European Pat. Off. . | |
| 287770 A1 | 2/1988 | European Pat. Off. . | |
| 588026 A2 | 3/1994 | European Pat. Off. . | |
| 1254773 | 11/1967 | Germany | 257/177 |

*Primary Examiner*—Mahshid D. Saadat
*Assistant Examiner*—T. M. Arroyo
*Attorney, Agent, or Firm*—Oblon, Spivak, McClelland, Maier & Neustadt

[57] ABSTRACT

In a pressure contact housing for semiconductor components, the gate electrode contact ring 4 is provided with spiral recesses 5. The latter can absorb axial movements produced during the assembly of the housing, without loading the material. A good and durable electrical contact between the gate electrode and the gate electrode contact ring is obtained thereby.

12 Claims, 2 Drawing Sheets

PRESSURE CONTACT HOUSING FOR SEMICONDUCTOR COMPONENTS

BACKGROUND OF THE INVENTION

1. Field of the Invention

The invention relates to the field of power electronics. It is based on a pressure contact housing for semiconductor components.

2. Discussion of the Background

A pressure contact housing has been described in European Patent Application EP-A1-0 588 026. This application discloses a high-power gate turn-off semiconductor component, in particular in the form of a GTO, having a semiconductor substrate in the form of a wafer, which is arranged concentrically in an annular insulating housing between a pressure-loadable cathode contact in the form of a disc and a likewise pressure-loadable anode contact in the form of a disc and is made to contact the side of the cathode contact by means of a gate contact, in the form of a gate electrode contact ring. In this case, the cathode contact is connected via a first cover to one end of the insulating housing and the anode contact is connected via a second cover to the other end of the insulating housing. This forms a component which is hermetically sealed from the outside, it being possible to apply a gate current to the gate contact via an outwardly routed gate supply line. A structure with low coupling inductance is achieved by virtue of the fact that the gate supply line is of rotationally symmetrical design and is arranged concentrically with respect to the cathode contact, and the gate supply line is electrically isolated from the cathode contact by means of a single insulator.

Pressure contact causes the gate electrode contact ring to move slightly in the axial direction. If the power semiconductor component is used, for example, in an experimental set-up, then it has to be repeatedly clamped in and released. As a result of the movements of the gate electrode contact ring caused thereby, the electrical contact to the gate electrode can be impaired or can be completely interrupted due to material fatigue.

SUMMARY OF THE INVENTION

Accordingly, the object of the present invention is to specify a pressure contact housing which ensures a permanent, reliable electrical contact to the gate electrode.

The core of the invention, therefore, is that a gate electrode contact ring has spiral recesses. As a result, axial movements caused during, clamping-in of the power semiconductor component are absorbed by the spiral recesses flexing and by the resulting small rotations of the inside of the ring.

In a preferred exemplary embodiment, the spiral is formed by an involute of a circle. That is to say that the edges of the recesses run along the involute of a circle. In order to obtain a simpler construction, this involute can be approximated by circular arcs.

A power semiconductor component which is accommodated in a housing according to the invention is additionally specified.

The advantage of the structure according to the invention is that the axial loads on the gate electrode contact ring during clamping-in of the housing are taken up by the spiral recesses without producing any appreciable load on the material. A permanent electrical contact to the gate electrode can be ensured thereby.

BRIEF DESCRIPTION OF THE DRAWINGS

The invention is explained in more detail below using exemplary embodiments in conjunction with the drawings, in which.

The reference symbols used in the drawings and their meaning are summarized in the list of designations. In principle, identical parts are provided with identical reference symbols in the figures.

DESCRIPTION OF THE PREFERRED EMBODIMENTS

Figure 2:
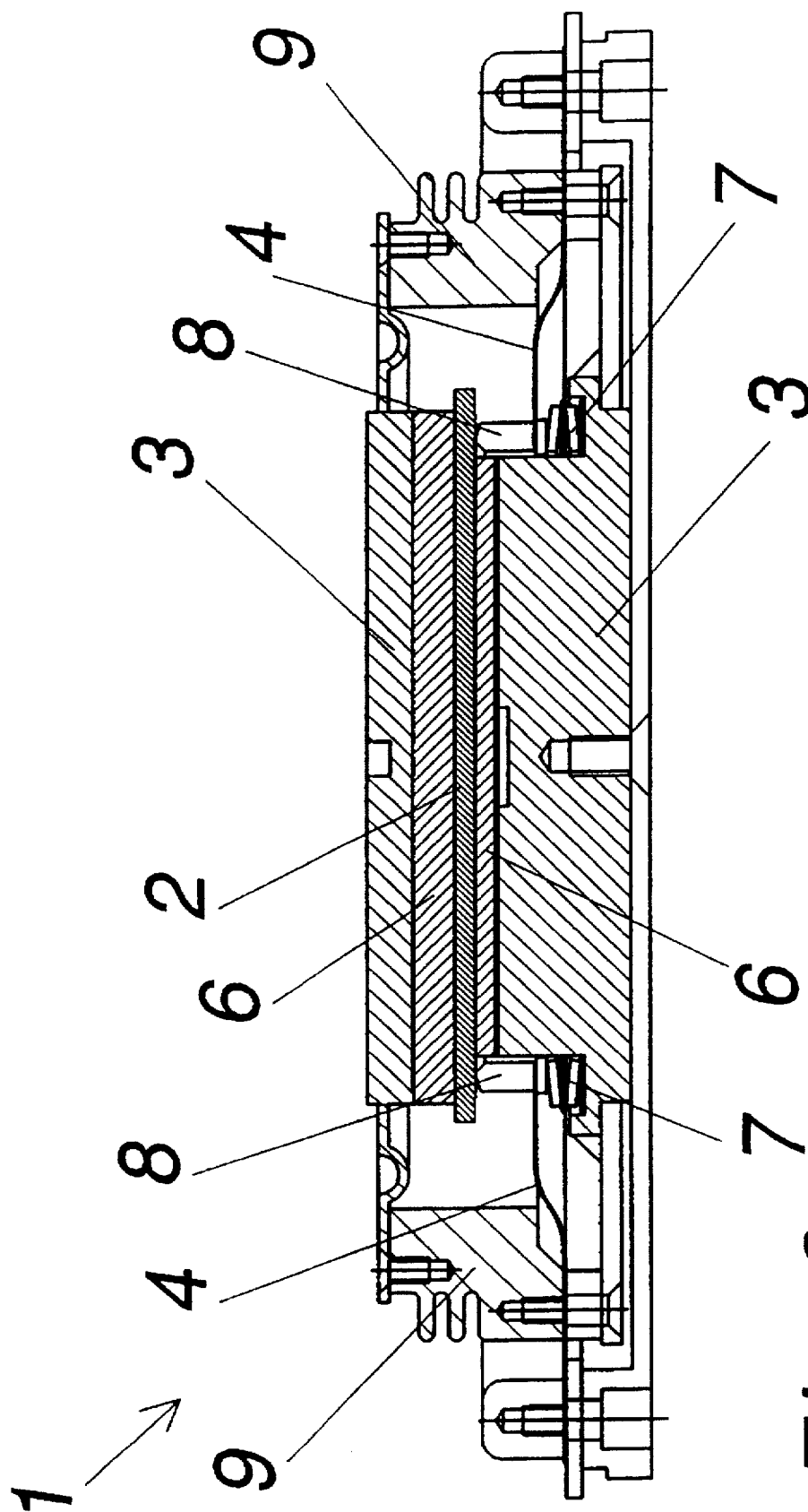
FIG. 2 shows, from the side and in section, a housing according to the invention.

FIG. 2 shows, in section, a pressure contact housing 1 according to the invention. The structure corresponds in principle to that in EP-A1-0 588 026. Reference is expressly made to this document at this point, and the structure of the pressure contact housing is described in the present text only in so far as is necessary for the invention.

2 designates a semiconductor component. It has an anode electrode and a cathode electrode. The anode is assigned to the upper side in FIG. 2 and is made to contact a corresponding upper contact plunger 3. The cathode is situated on the lower side in FIG. 2 and is made to contact a lower contact plunger 3. In order to improve the thermal contact, a molybdenum wafer 6 is provided in each case between the contact plungers 3 and the semiconductor component 2. The gate electrode is made to contact the semiconductor component by means of rotationally symmetrical gate electrode supply lines 8 supported on springs 7 and is routed outwards via a gate electrode contact ring 4. The whole device is integrated into an insulating housing 9.

Figure 1:
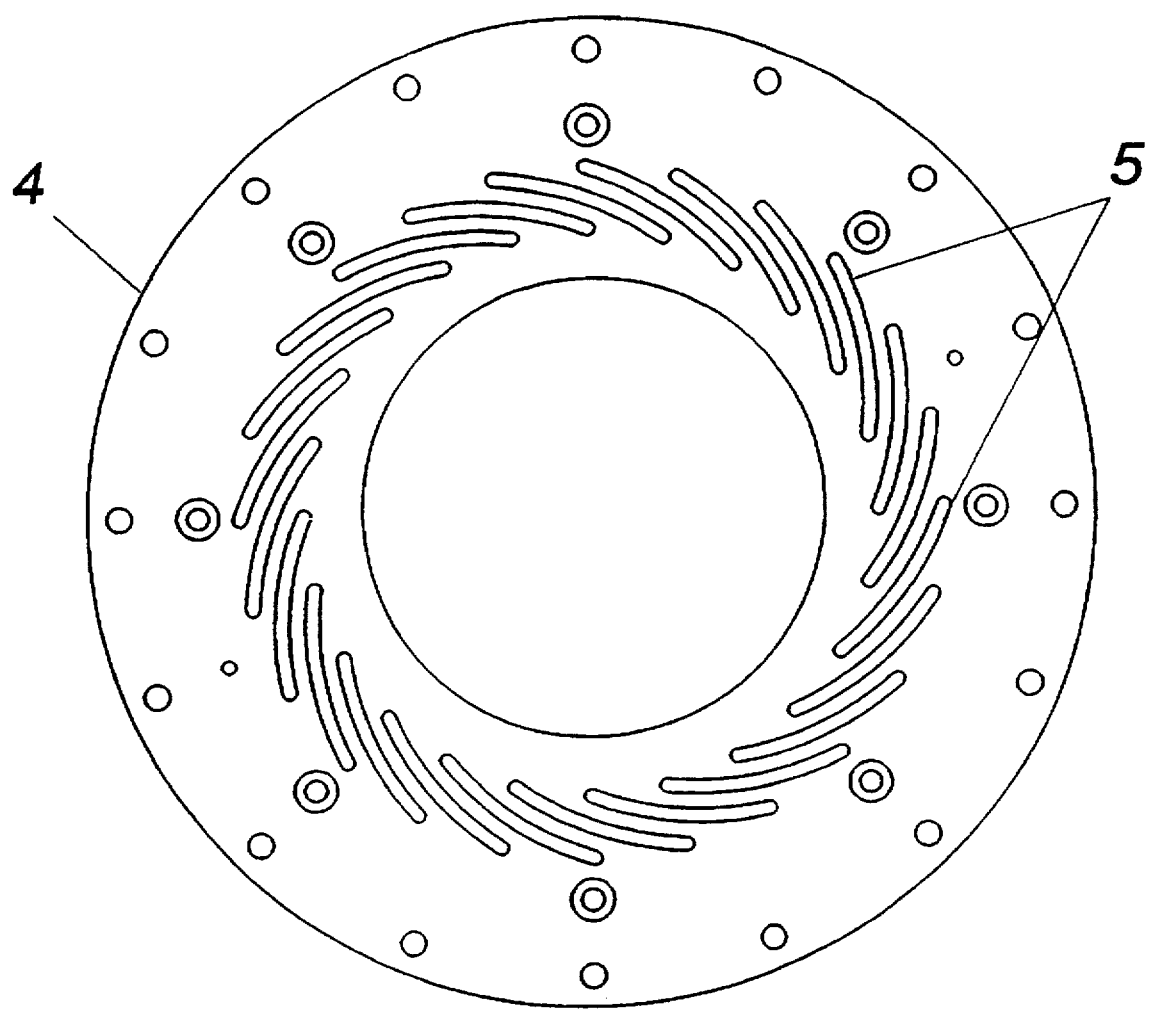
FIG. 1 shows, from above, a gate electrode contact ring according to the invention.

The gate electrode contact ring 4 is of primary interest for the invention. When the semiconductor component 2 is being clamped into the housing 1, pressure is applied to the contact plungers 3, and the gate electrode contact ring 4 also moves slightly in the axial direction. As can clearly be seen in FIG. 2, it is also partly curved. In order to obtain the most durable electrical contact possible, the gate electrode contact ring 4 according to the invention is designed as in FIG. 1.

Spiral recesses 5 are provided in the curved region. These have the advantage that the gate electrode contact ring 4 can absorb axial movements during assembly without any problems. The spiral recesses 5 are flexed in the process and the inside of the ring also rotates slightly. The edges of the recesses 5 preferably run along an involute of a circle. However, in order to simplify production, for example for numerically controlled machines, the involute can also be approximated by circular arcs.

Moreover, the gate electrode contact ring 4 can be provided with holes for receiving fastening screws.

Since the spiral recesses 5 can absorb the movements produced during the assembly of the housing, the material of the gate electrode contact ring is loaded only slightly. As a result, material fatigue phenomena, which can result in the electrical contact being impaired or even interrupted because of fracture, does not occur.

List of designations

1 Pressure contact housing
2 Semiconductor component
3 Contact plunger
4 Gate electrode contact ring
5 Recess
6 Molybdenum wafer
7 Spring
8 Gate electrode supply line 9 Insulating housing

I claim:

1. Pressure contact housing for a semiconductor component, which has a first and a second main electrode and a gate electrode, the first and second main electrodes being arranged between two contact plungers and pressure being applied to them by the said plungers, and the gate electrode being connected to a gate electrode contact ring which is routed out of the housing, characterized in that the gate electrode contact ring has spiral recesses, wherein each spiral recess runs along a spiral with a starting point corresponding to a center of the gate electrode contact ring.

2. Housing according to claim 1, characterized in that the edges of the recesses run along an involute of a circle.

3. Housing according to claim 2, characterized in that the involute of the recess edges is approximated by circular arcs.

4. Power semiconductor component, characterized in that it comprises a housing according to claim 1.

5. Power semiconductor component, characterized in that it comprises a housing according to claim 2.

6. Power semiconductor component, characterized in that it comprises a housing according to claim 3.

7. A pressure contact housing for a semiconductor component, comprising:

a first main electrode, a second main electrode and a gate electrode;

two contact plungers arranged around the first and second main electrodes, and the two contact plungers applying pressure to the first and second main electrodes;

a gate electrode contact ring connected to the gate electrode, wherein the gate electrode contact ring includes spiral recesses, wherein each spiral recess runs along a spiral with a starting point corresponding to a center of the gate electrode contact ring.

8. The pressure contact housing according to claim 7, wherein edges of the spiral recesses run along an involute of a circle.

9. The pressure contact housing according to claim 8, wherein the involute of the circle is approximated by circular arcs.

10. A pressure contact housing for a semiconductor component, comprising:

a first main electrode means, a second main electrode means and a gate electrode means;

two contact plunger means arranged around the first and second main electrode means, and the two contact plunger means for applying pressure to the first and second main electrode means;

a gate electrode contact ring means connected to the gate electrode means, wherein the gate electrode contact ring means includes spiral recess means, wherein each spiral recess means runs along a spiral with a starting point corresponding to a center of the gate electrode means.

11. The pressure contact housing according to claim 10, wherein edges of the spiral recess means run along an involute of a circle.

12. The pressure contact housing according to claim 11, wherein the involute of the circle is approximated by circular arcs.

* * * * *